US005359664A

United States Patent [19]

Steuben

[11] Patent Number: 5,359,664

[45] Date of Patent: Oct. 25, 1994

[54] LOUDSPEAKER SYSTEM

[75] Inventor: Richard Steuben, 3913 Natoma Way, Sacramento, Calif. 95838

[73] Assignee: Richard Steuben, Sacramento, Calif.

[21] Appl. No.: 168,689

[22] Filed: Dec. 16, 1993

Related U.S. Application Data

[63] Continuation of Ser. No. 861,125, Mar. 31, 1992.

[51] Int. Cl.[5] .......... H03G 5/00

[52] U.S. Cl. .......... 381/88; 381/154; 381/160; 381/90; 381/188; 181/153; 181/156

[58] Field of Search .......... 181/153, 156; 381/99, 381/180, 160, 154, 88, 90, 188, 265

[56] References Cited

U.S. PATENT DOCUMENTS

| | | | |
|---|---|---|---|
| 3,327,808 | 6/1965 | Sharper . | |
| 4,137,510 | 1/1979 | Iwahara | 381/100 |
| 4,298,087 | 11/1981 | Launay | 181/153 |
| 4,378,471 | 3/1983 | Shintaku | 381/156 |
| 4,434,507 | 2/1984 | Thomas | 381/160 |
| 4,593,784 | 6/1986 | Flanders | 181/144 |
| 4,597,100 | 6/1986 | Grodinsky et al. | 381/99 |
| 4,616,731 | 10/1986 | Robinson | 181/153 |
| 4,771,466 | 9/1988 | Modafferi | 381/99 |
| 5,177,329 | 1/1993 | Klayman | 181/156 |
| 5,189,706 | 2/1993 | Saeki | 181/156 |

*Primary Examiner*—Forester W. Isen

*Attorney, Agent, or Firm*—Majestic, Parsons, Siebert & Hsue

[57] ABSTRACT

A loudspeaker system is arranged to house an electromagnetic loudspeaker driver of the type having both front and back acoustic waves. The loudspeaker driver is reversed mounted such that its weaker back waves are emitted directly to the outside, while its stronger front waves are directed through an internal passageway of the loudspeaker enclosure before adding in phase and exiting with the back waves. The front waves are phase-shifted by half a wavelength through the internal passageway which acts as a transmission line. The attenuation suffered through the transmission line is offset somewhat by the stronger front waves such that the differential amplitudes of the front and back exiting waves are minimized. Throughout the transmission line, the flow of the sound waves is kept circular and laminar in order to maintain coherence and to further minimize loss of energy due to turbulence. These are accomplished by the use of a cylindrical passageway, a streamlining reflecting cone, and an outer reflecting ring. Finally, the exiting front and back waves are deflected into the listening environment via a sound reflecting surface positioned near the exit of the loudspeaker enclosure. Additionally, the loudspeaker system employs an efficient crossover network which include a low-pass network branch for each loudspeaker driver in the system.

6 Claims, 4 Drawing Sheets

LOUDSPEAKER SYSTEM

This is a continuation of application Ser. No. 07/861,125, filed Mar. 31, 1992.

BACKGROUND OF THE INVENTION

This invention relates to loudspeakers, and more particularly to a loudspeaker enclosure and driver system using a transmission-line principle in which waves from back and front sides of a loudspeaker driver are added in phase.

Historically, there have been several ways to mount a loudspeaker driver. One way is to free mount a loudspeaker driver in which both its front and back faces are open and unobstructed. This approach is problematic because of partial cancellation of the front waves by the back waves since they are 180° out of phase.

An alternative to a free-mounted loudspeaker driver is an acoustic suspension loudspeaker in which the driver is mounted on the loudspeaker enclosure's wall facing outward and with its back face emitting into the enclosure. This approach excludes the back waves from coming out of the enclosure and prevents them from interfering with and canceling the front waves, but is inefficient in that it makes no use of the back waves.

To make use of the back waves also, the transmission line concept has been used for many years. An example of such systems is disclosed in U.S. Pat. No. 3,327,808. The back waves inside a loudspeaker enclosure is channeled by a passageway or "transmission line" to bring them out of the enclosure and add to the front waves. The length of the transmission line is tuned such that sound waves traveling through it will undergo a phase shift of 180° so that they will be in phase with the front waves. The back waves can then be advantageously summed to the front waves producing a more efficient loudspeaker.

Prior transmission-line loudspeakers were less than optimum. For example, the back waves emerging out of the transmission line is much attenuated. The large sound pressure differential between the sound pressure levels contributed from the front and back faces of the loudspeaker driver results in less than optimum resultant sound field. The problem is aggravated by the front and back waves being emitting in two different portals resulting in a skewed dipole sound field. Another problem is the turbulence caused by diffractions in the passageway, resulting in variation in path lengths and therefore dispersion of phase shifts and reduced coherence for the back waves.

It is therefore an object of this invention to increase loudspeaker efficiency and sound quality and furthermore to provide loudspeaker systems which do not suffer from said problems.

SUMMARY OF THE INVENTION

These and additional objects are accomplished by improvements in a loudspeaker system employing transmission-line concepts.

According to one aspect of the invention, the loudspeaker system comprises a loudspeaker enclosure with a passageway therein acting as a transmission line. A loudspeaker driver is mounted backward on the loudspeaker enclosure such that its weaker emitting back face is facing outward and its stronger emitting front face is facing inward into the passageway. This helps to reduce the sound pressure differential between the front and back waves when they are finally added.

According to another aspect of the invention, a loudspeaker enclosure configuration is employed such that a high degree of coherence is maintained between the front and back waves emitted from a driver which is an extended source. This is accomplished by having the passageway disposed symmetrically about the driver. In this way, the path length from each emitting point on the extended source through the passageway is the same.

In the preferred embodiment, the loudspeaker system comprises a loudspeaker driver mounted on a loudspeaker enclosure. The loudspeaker enclosure comprises two concentric cylinders each having first and second ends. The second end of the outer cylinder extends further than that of the inner cylinder and is closed off by an end disk. The two cylinders define a passageway which runs from the first to the second end of the inner cylinder and turns around at the end disk of the outer cylinder and then runs from the second to the first end along the annular space between the outer and inner cylinder. The loudspeaker driver is mounted with its back face facing out and its front face facing into the first end of the inner cylinder. In this way, the stronger front waves are sent through the passageway while the weaker back waves are emitting directly out of the loudspeaker enclosure. The length of the passageway is tuned such that the front waves traveling through it undergo a phase shift of 180°. In this way, the emerging front waves at the first ends of the two cylinders will add in phase with the back waves.

One advantage of such a symmetric configuration is that turbulence and the resulting variation in path lengths in the passageway are minimized. The loudspeaker driver is symmetrically mounted about the passageway resulting in substantially equal path lengths among points on the extended driver. This helps to maintain circular formation of sound waves throughout the transmission lines.

Another advantage of such a configuration is that the front and back waves are substantially summed and emitted to the outside at the same location. This avoids the problems associated with dipole radiation of conventional designs.

According to another aspect of the invention, turbulence may be further minimized by streamlining the closure at the second end of the outer cylinder where the sound waves reverse in direction from the inner cylinder to the annular space between the inner and outer cylinders. In the preferred embodiment, a reflecting ring, in the shape of a trapezoidal basin with a streamlining cone at its base, is placed on the end disk.

Another aspect of this invention is to reflect the summed front and back sound waves into a listening position by use of a sound reflecting surface positioned overhead near the top of the loudspeaker driver.

According to another aspect of the invention, the efficiency of the loudspeaker system is further enhanced by employing a highly efficient crossover network. The crossover network comprises a network branch for each loudspeaker driver in the system. In each network branch, a low-pass filter essentially allows audio signal with frequency below a predetermined crossover frequency to feed into the loudspeaker driver in the branch. The next higher frequency branch obtains the audio signal by tapping across the low-pass filter of the lower frequency branch.

Additional objects, features and advantages of the present invention will be understood from the following description of the preferred embodiments, which description should be taken in conjunction with the accompanying drawings.

DESCRIPTION OF THE PREFERRED EMBODIMENT

Figure 1:
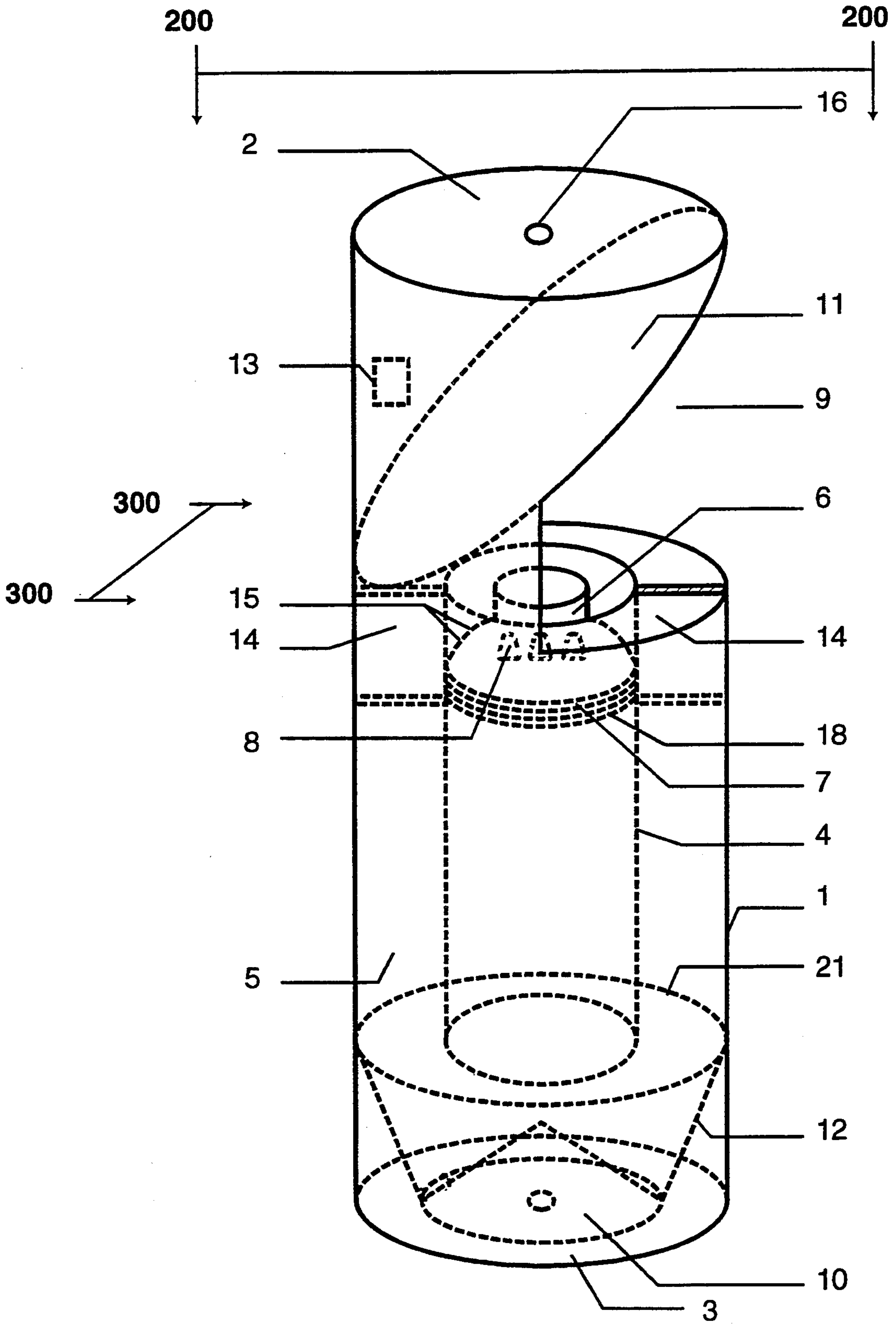
FIG. 1 shows a transparent perspective view of the loudspeaker system according to a preferred embodiment of the present invention.
Figure 2:
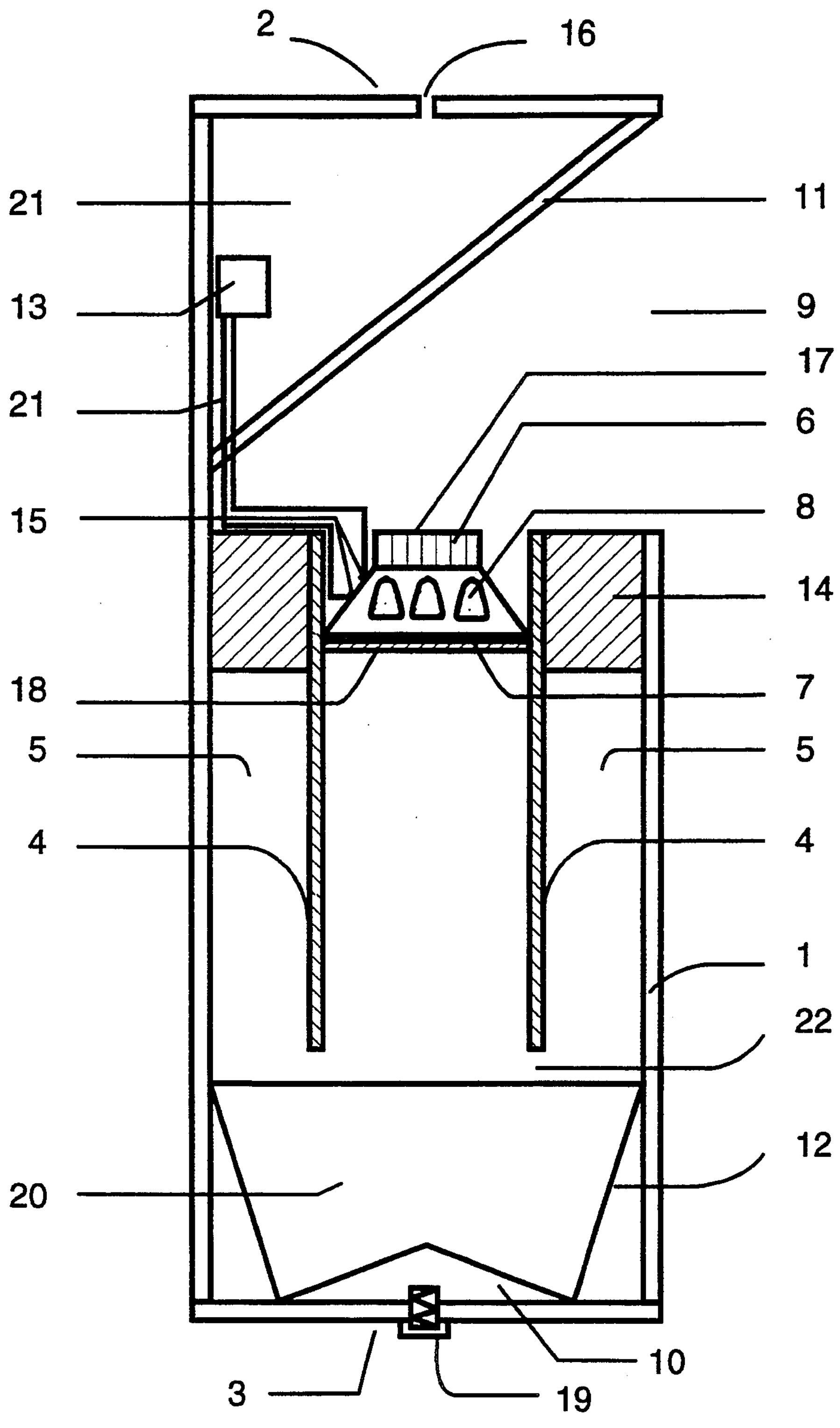
FIG. 2 is a side cross-sectional view of the loudspeaker system along the line A—A shown in FIG. 1.

Referring first to the embodiment illustrated in FIGS. 1 and 2, a transmission-line loudspeaker system includes a loudspeaker enclosure, a loudspeaker driver 6 and a crossover 13. Such a loudspeaker system is suitable for efficiently reproducing sound sources in the bass and lower mid-range of the audible spectrum. It can be used in conjunction with other mid-range and high frequency drivers (not shown) and loudspeaker systems to form a full-range loudspeaker system.

The loudspeaker enclosure is shown to include an outer cylinder enclosure 1, an inner cylinder enclosure 4 concentrically disposed within the outer cylinder. In the preferred embodiment, the cylinder enclosures 1, 4 are positioned as a concentric column having an annular space 5 and top and bottom ends. The loudspeaker driver 6 is mounted face down near the top end of the inner cylinder enclosure 4 so that its stronger front waves are emitting into the inner cylinder enclosure whereas its weaker back waves are emitting directly onto the outside.

The inner cylinder is supported by the outer cylinder by means of supports 14, and its bottom end is shorter relative to that of the outer cylinder enclosure. The bottom ends of the outer cylinder enclosure 1 is closed off by a bottom disk 3. In this way, a passageway for the sound from the front of the driver is created where the it travels down the inner cylinder 4 and opens up into the outer cylinder 1 at the bottom end and proceeds to go up to the top end through the annular space 5. The front waves emerging out of the annular space 5 is added to the back waves at the top end of the inner cylinder enclosure 4. The summed front and back waves emanate out of the loudspeaker enclosure through a large opening 9 on the side wall of the outer enclosure 1 located near and above the top end of the inner cylinder enclosure 4.

Both the outer and inner cylinder enclosures 1, 4 are preferably constructed from particle board. The inner walls of the outer cylinder enclosure and both the inner and outer walls of the inner cylinder enclosure are preferably covered by sound damping material such as felt to reduce cross reflections. For the outer cylinder enclosure 1, suitable dimensions for the height, inner diameter, and thickness are 32 inches, $14\frac{3}{4}$ inches and $\frac{3}{4}$ inch, respectively.

The diameter of the inner cylinder enclosure is such that it is commensurate with that of the driver 6. In one example, the inner cylinder enclosure 4 has an inner diameter of approximately $8\frac{1}{2}$ inches to accommodate an 8-inch diameter loudspeaker driver 6. The inner cylinder has a wall thickness of $\frac{3}{4}$ inch In this particular embodiment, the length of said inner cylinder is about 18 inches, although this length may be varied to correspond to different resonant frequencies. The inner cylinder is secured by means of at least two, preferably three or four, supports 14 along its length. These supports are each in the form of a rectangular disk having length, width and thicknesses of 6 inches, 3 inches and $\frac{3}{4}$ inch, respectively. Each support is fastened to the inner cylinder from the outer cylinder 1 by means of wood glue.

An 8-inch diameter 8-Ohm woofer type loudspeaker driver 6 is placed in the top end of the inner cylinder enclosure 4 with the top surface of its magnet 17 flush with the end of said inner cylinder. The loudspeaker driver is secured by resting it against a ring 18 inserted into the inner cylinder 4 and secured thereto by means of glue. Said ring has an outer diameter of $8\frac{1}{2}$ inches and an inner diameter of $7\frac{1}{2}$ inches. It is crucial that the loudspeaker driver is placed into the inner cylinder 4 with its front face 7 facing downward into the inner cylinder 4, because the front face radiates higher sound pressure levels that the back face 8. This reversed configuration is advantageous in that the stronger front waves help to compensate for the attenuation suffered through the passageway. The emerging front waves will not have such a large sound level differential with that of the back front as compared to the conventional case.

The overall distance from the front face 7 of the loudspeaker driver 6 to the top surface of the bottom disk 3 may be approximately 24 inches. This corresponds to one-half of the length of a half wave for a typical 96 inch wave radiating from the front face 7 of the loudspeaker driver 6. Generally, the determining factor is that the length of the passageway defined by the inner cylinder enclosure 4 and the annular space 5 must be such that the phase of the front waves through it will be shifted by 180° (or half a wavelength) so that the front and back waves are in phase when they are added.

According to another aspect of the invention, turbulence may be further minimized by streamlining the closure at the bottom end of the outer cylinder where the sound waves reverse in direction from the inner cylinder enclosure 4 to the annular space 5 between the inner and outer cylinders. In the preferred embodiment, an outer reflecting ring 12, in the shape of a trapezoidal basin with a streamlining cone 10 at its base, is placed on the bottom disk 3.

The outer reflecting ring 12 is preferably made of sheet metal. It has a trapezoidal side view and its plan view consists of two concentric circles. The bottom circle 20 is of substantially the same diameter as the base diameter of the streamlining cone 10. The top circle is of substantially the same diameter as the inner diameter of the outer cylinder enclosure 1, or approximately $14\frac{3}{4}$ inch. The vertical distance between the top and bottom circles of the outer reflecting ring 12 may vary. However, in this particular embodiment, that distance is approximately 8 inches.

The streamlining cone 10 is also preferably made of sheet metal and is placed on the top surface of the bottom disk 3 and is secured thereto by means of a 3/16-inch diameter bolt 19. The base diameter of said cone is approximately 9.75 inches, slightly over ten percent larger than the outside diameter of the inner cylinder enclosure 4. The height of said cone may vary, but in the present embodiment it is approximately 2 inches.

Thus, the inner cylinder enclosure 4, the space 20 defined by the outer reflecting ring 12 and the streamlining cone 10, the annular space 5, and the opening 9, define a passageway or a transmission line which allows the sound pressure radiated from the loudspeaker driver's front face 7 to shift its phase by 180 degrees and exit the annular space 5 in the same direction as the back sound waves radiated from the loudspeaker driver's back face 8.

One advantage of such a symmetric configuration is that turbulence and the resulting variation in path lengths in the passageway are minimized. The loudspeaker driver is symmetrically mounted about the passageway resulting in substantially equal path lengths among points on the extended driver. This helps to maintain circular formation of sound waves throughout the transmission lines.

Another advantage of such a configuration is that the front and back waves are substantially summed and emitted to the outside at the same location. This avoids the problems associated with dipole radiation of conventional designs.

Another aspect of the invention is to reflect the summed front and back sound waves into a listening position by use of a sound reflecting surface positioned overhead near the top of the loudspeaker driver 17.

The sound reflecting surface 11 is made of particle board and is fastened to the outer cylinder 1 by wood glue. This sound reflective surface is in ellipsoid shape, having length, width and thicknesses of $20\frac{7}{8}$, $14\frac{3}{4}$ and $\frac{3}{4}$ inch respectively In the present embodiment, the reflecting board 11 as at 45 degree angles with a cross-sectional plane through the top end of the inner cylinder enclosure 4. Different angles can be used depending on reflecting characteristics desired.

Figure 4:
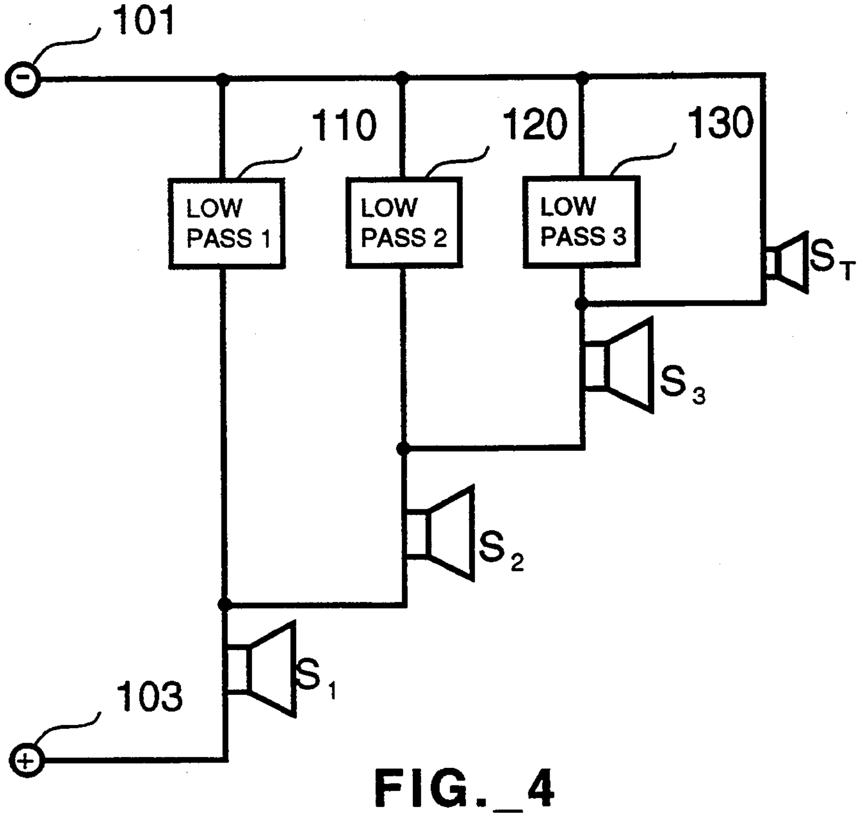
FIG. 4 is a schematic circuit diagram for a four-way crossover circuit, suitable for use in the present loudspeaker system.
Figure 5:
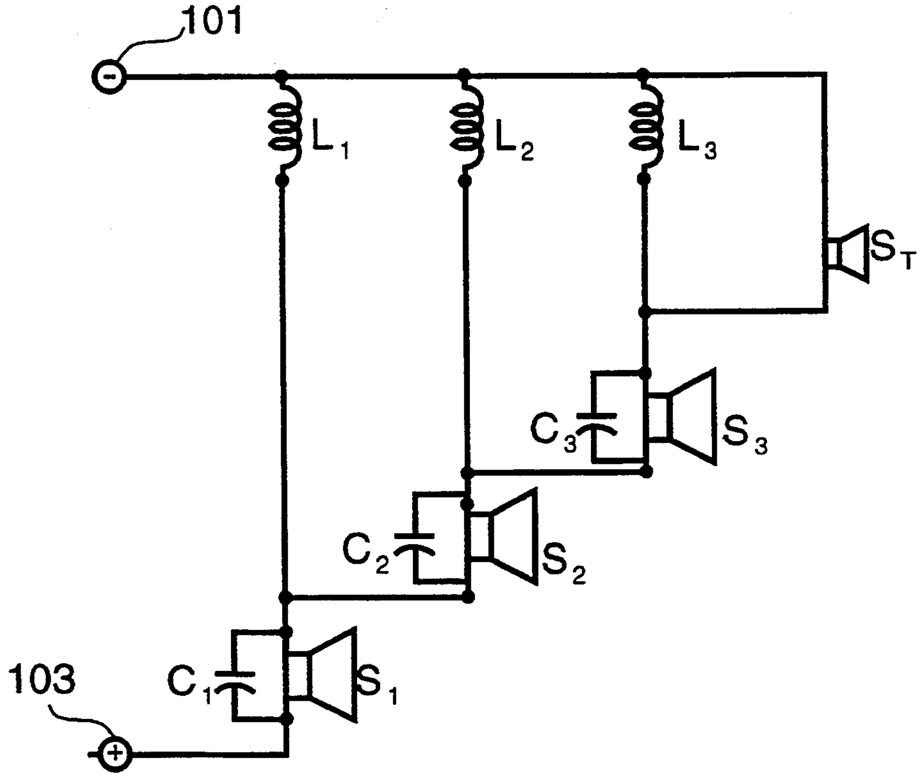
FIG. 5 is another schematic circuit diagram for a four-way crossover circuit, suitable for use in the present loudspeaker system.

FIGS. 4 and 5 show schematic diagrams for two crossover circuits, which are the preferred crossover networks for use with the present invention if more than one loudspeaker driver is used in the system, or if the system is to be used in conjunction with additional external loudspeaker systems. For example, in one embodiment, all the drivers are mounted on one loudspeaker unit, with a low frequency woofer mounted as shown in FIGS. 1 and 2 and the higher frequency drivers in another enclosure (not shown) attached to the woofer loudspeaker enclosure. In another embodiment, the woofer is in a stand alone woofer enclosure as shown in FIGS. 1 and 2, and the midrange and tweeter drivers are in a separate, satellite enclosure. The crossover network 13 may be conveniently located near the top of the outer enclosure 1, above the reflecting board 11 and is connected to the loudspeaker driver terminals 15 by means of wires 21 (see FIG. 2).

Figure 3:
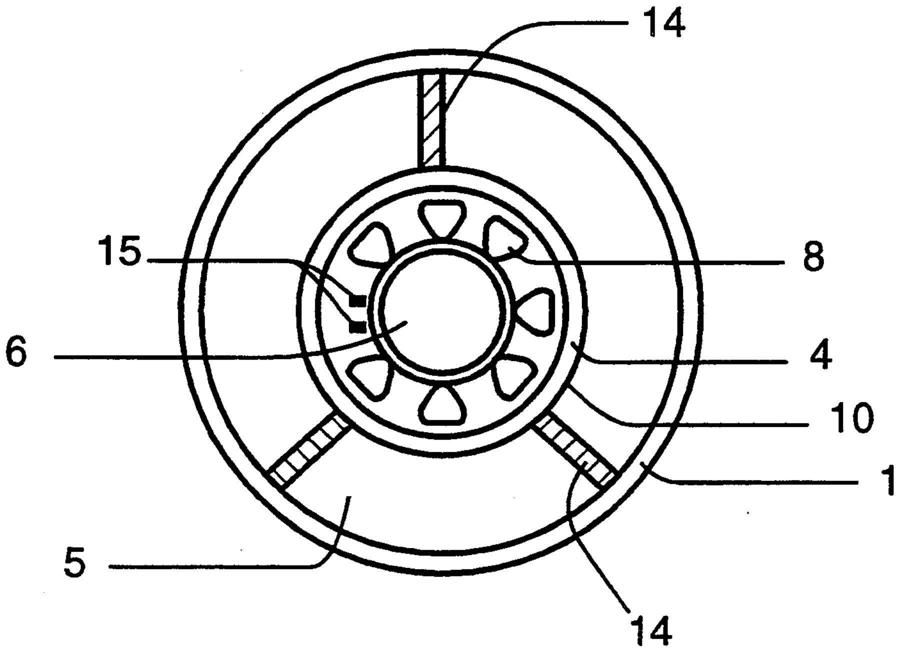
FIG. 3 is a side cross-sectional view of the loudspeaker system along the line B—B shown in FIG. 1, showing details of the driver mounted on the concentric inner and outer cylinders.

FIG. 4 shows a highly efficient 4-way crossover network for four loudspeaker drivers, namely a woofer, $S_1$, a mid-range driver, $S_2$, a higher mid-range driver, $S_3$, and a tweeter, $S_T$. The woofer $S_1$ is the same as the loudspeaker driver 6 shown in FIGS. 1, 2 and 3. The frequency range for each driver is partitioned by a series of in-line low-pass filters 110, 120 and 130. In one embodiment, each in-line low-pass filter is an inductor with inductance $L_i$ forming a first order filter. The crossover frequency $f_c(i)$ ($-3$ db point) for each driver $S_i$ is predetermined and is generally given by $$f_c(i) = \frac{R_i}{2\pi L_i},\ i = 1, 2, \ldots$$

where $R_i$ is the total DC resistance in the loudspeaker driver $S_i$ and the inductor $L_i$.

An audio signal from an audio amplifier (not shown) is input into the crossover network by connection to terminals 101 and 103. The terminal 101 is grounded. In the network branch of $S_1$, the audio signal drives the woofer $S_1$ through the in-line low-pass filter 110. Essentially the in-line low-pass filter 110 blocks frequencies above $f_C$(1) from reaching $S_1$.

The crossover network is unconventional in that it does not employ a combination of low- and high-pass filters. Instead, a hierarchial series of low-pass filters in each network branch at progressively higher crossover frequencies is used.

Thus, in the network branch for $S_2$, the driver $S_2$ is in series with the in-line low-pass filter 120. The construction of network branches for any additional loudspeaker drivers is similar. In the case of the highest frequency tweeter $S_T$ in the system, an in-line low-pass filter in the network branch thereat is optional. In the preferred embodiment, it is omitted.

Another important feature is that each of the higher frequency network branch taps its audio signal by shunting across the in-line low-pass filter of the next lower frequency network branch.

Thus, unlike conventional implementation, where each network branch taps in parallel its audio output signal from the terminals 101 and 103, the present invention has each network branch tapping across the in-line low-pass filter of the next lower frequency network branch. For example, the network branch for $S_2$ is drawing the audio signal by shunting across the in-line low-pass filter 110, the network branch for $S_3$ is drawing the audio signal by shunting across the in-line low-pass filter 120. Finally, the tweeter driver $S_T$ draws the audio signal from shunting across the in-line low-pass filter 130. The low-pass filter in each network branch passes a substantial portion of the audio signal below the crossover frequency $f_c(i)$ to the loudspeaker driver $S_i$. The complement of the audio signal (i.e., that above $f_c(i)$) is therefore found across the low-pass filter to be tapped by the next higher frequency network branch. The advantages of drawing the audio signal from across the in-line low-pass filter of the next lower frequency branch instead of from the terminals 101, 103 is that the input impedance and bandwidth for each branch is better controlled. Also, the elimination of additional high-pass filters helps to create a more efficient network.

FIG. 5 shows another embodiment of a 4-way crossover network for four loudspeaker drivers, namely a woofer, $S_1$ a mid-range driver, $S_2$, a high mid-range driver, $S_3$, and a tweeter, $S_T$. The woofer is the same as the loudspeaker driver 6 shown in FIGS. 1, 2 and 3. The crossover network is similar to that of FIG. 4, except with an additional high-pass shunt $C_i$ for the loudspeaker driver $S_i$ in each network branch. Audio output signal from an audio amplifier (not shown) is input into the crossover network by connection to terminals 101 and 103. The terminal 101 is grounded. The audio output signal drives the woofer $S_1$ by way of a second-order low-pass filter formed by a serial inductor $L_1$ and a shunt capacitor $C_1$. The crossover frequency $f_c(i)$ (−3 db point) for each driver $S_i$ is generally given by $$f_c(i) = \frac{1}{2\pi\sqrt{L_iC_i}}, \quad i = 1, 2, \ldots$$

Similarly, the network branch for $S_2$ has the loudspeaker driver $S_2$ in series with an inductor $L_2$ and shunted by a capacitor $C_2$. The network branch for $S_2$ draws the audio signal from across $L_1$ of the lower frequency network branch. In the same way, the network branch for $S_3$ includes a serial inductor $L_3$ and a shunt capacitor $C_3$, and the branch is drawing the audio signal from across $L_2$. Finally, the network branch for the tweeter driver $S_T$ may also optionally include a second order low pass filter (not shown). In the preferred embodiment, it is not necessary.

Although crossover networks for loudspeaker system having four drivers are shown and described for illustrative purpose, Networks for loudspeaker systems having other number of drivers are contemplated and are obvious and apparent.

It is to be understood that while the invention has been described above in conjunction with the preferred specific embodiments, the description and examples are intended to illustrate and not limit the scope of the invention, which is defined by the scope of the appended claims.

It is claimed:

1. A loudspeaker system comprising:

concentric outer and inner cylinder enclosures defining an annular space therebetween and having first and second ends;

an end disk closing off said outer cylinder enclosure at its second end;

said inner cylinder enclosure extending short of said end disk such that a passageway runs from the first to the second end through the inner cylinder enclosure and then turns back at the end disk to the first end through the annular space;

a loudspeaker driver capable of producing sound waves from its front and back faces, the front face generating substantially greater sound pressure than the back face, said loudspeaker driver having a diameter commensurate with that of said inner cylinder and being mounted near the first end thereof and with the front face facing into said passageway, such that resultant sound waves are formed outside the first end of the inner cylinder enclosure by summation of the sound waves directly from the back face and the sound waves indirectly from the front face through the passageway;

said passageway having a length such that the sound waves indirectly from the front face through the passageway is in phase with the sound waves directly from the back face when they form the resultant waves; and an opening on the outer cylinder enclosure near the first end for the resultant sound waves to exit to a listening position.

2. The loudspeaker system as in claim 1, further comprising streamlining baffles having substantially cylindrical symmetry, said streamlining baffles being concentrically mounted near the end disk inside said outer cylinder enclosure for defining a smooth transitory passageway from said inner cylinder enclosure to said annular space.

3. The loudspeaker system as in claim 1, further comprising a sound reflecting baffle near the first end for directing the resultant waves to exit via said opening.

4. In a loudspeaker system having a hierarchy of a lowest-frequency loudspeaker driver operating over a lowest predetermined frequency range, a highest-frequency loudspeaker driver operating over a highest predetermined frequency range, a crossover network for dividing an input audio signal into a hierarchy of predetermined frequency ranges appropriate for each of the loudspeaker drivers comprising:

a hierarchy of network branches corresponding to said hierarchy of loudspeaker drivers, said hierarchy of branches further comprising:

a lowest-frequency network branch for the lowest-frequency loudspeaker driver, said lowest-frequency network branch having a low-pass filter of predetermined crossover frequency that includes an in-line component connected in series with the lowest-frequency loudspeaker driver and the input audio signal;

a highest-frequency network branch for the highest-frequency loudspeaker driver, said highest-frequency network branch including the highest-frequency loudspeaker driver shunting across the in-line component of the low-pass filter of the lowest-frequency network branch in the hierarchy;

said crossover network further including one or more intermediate-frequency loudspeaker drivers operating over intermediate predetermined frequency ranges; and wherein said hierarchy of branches further comprising:

one or more intermediate-frequency network branches, each corresponding to an intermediate-frequency driver, each said intermediate-frequency network branch having a low-pass filter of predetermined crossover frequency that includes an in-line component connected in series with the corresponding intermediate-frequency loudspeaker driver and shunting across the in-line component of the low-pass filter of the next lower-frequency network branch in the hierarchy.

5. A crossover network as in claim 4, wherein the in-line component of the low-pass filter of predetermined crossover frequency in each network branch is an inductor.

6. A crossover network as in claim 5, wherein the loudspeaker driver in each network branch except the highest-frequency loudspeaker driver is shunted by a capacitor of predetermined value.

* * * * *